(12) United States Patent
Yan et al.

(10) Patent No.: US 12,317,667 B2
(45) Date of Patent: May 27, 2025

(54) FLEXIBLE PHOTOELECTRIC DEVICE MODULE AND METHOD FOR MANUFACTURING SAME

(71) Applicant: SUZHOU INSTITUTE OF NANO-TECH AND NANO-BIONICS (SINANO), CHINESE ACADEMY OF SCIENCES, Suzhou (CN)

(72) Inventors: Lingpeng Yan, Suzhou (CN); Yunfei Han, Suzhou (CN); Hao Zhang, Suzhou (CN); Chao Gong, Suzhou (CN); Jian Lin, Suzhou (CN); Qun Luo, Suzhou (CN); Changqi Ma, Suzhou (CN)

(73) Assignee: SUZHOU INSTITUTE OF NANO-TECH AND NANO-BIONICS (SINANO), CHINESE ACADEMY OF SCIENCES, Suzhou (CN)

( * ) Notice: Subject to any disclaimer, the term of this patent is extended or adjusted under 35 U.S.C. 154(b) by 135 days.

(21) Appl. No.: 17/925,611

(22) PCT Filed: Dec. 27, 2021

(86) PCT No.: PCT/CN2021/141442
§ 371 (c)(1),
(2) Date: Nov. 16, 2022

(87) PCT Pub. No.: WO2022/143480
PCT Pub. Date: Jul. 7, 2022

(65) Prior Publication Data
US 2023/0345746 A1    Oct. 26, 2023

(30) Foreign Application Priority Data

Dec. 28, 2020  (CN) .......................... 202011584469.6
Dec. 21, 2021  (CN) .......................... 202111576832.4

(51) Int. Cl.
| | | |
|---|---|---|
| *H10K 30/82* | (2023.01) | |
| *H10K 77/10* | (2023.01) | |
| *H10K 30/35* | (2023.01) | |

(52) U.S. Cl.
CPC ........... *H10K 30/82* (2023.02); *H10K 77/111* (2023.02); *H10K 30/352* (2023.02)

(58) Field of Classification Search
None
See application file for complete search history.

(56) References Cited

U.S. PATENT DOCUMENTS

2005/0263180 A1   12/2005  Montello et al.
2006/0180195 A1*   8/2006  Luch ................. H01L 31/03925
                                                              136/244

(Continued)

FOREIGN PATENT DOCUMENTS

| CN | 102598268 A | 7/2012 |
|---|---|---|
| CN | 102867889 A | 1/2013 |

(Continued)

OTHER PUBLICATIONS

Machine translation of CN103474485A (Year: 2013).*

(Continued)

*Primary Examiner* — Ryan S Cannon
(74) *Attorney, Agent, or Firm* — Bayramoglu Law Offices LLC

(57) ABSTRACT

A flexible photoelectric device module and a method for preparing same are provided. The module includes a plurality of photoelectric device units. One photoelectric device unit includes a bottom electrode, a functional layer and a top electrode. The bottom electrode includes a light-transmittance insulating base, and a first electrode, a second electrode and a third electrode which are arranged on two side surfaces of the base. The first electrode is a transparent (Continued)

electrode. The second electrode and the first electrode are in electric contact with each other. The second electrode and the third electrode are electrically connected through a conducting channel. The conducting channel runs through the base along a thickness direction. The third electrode in one photoelectric device unit is electrically connected to the top electrode or the first electrode in another photoelectric device unit, so that the two photoelectric device units are disposed in series or in parallel.

10 Claims, 11 Drawing Sheets

(56) References Cited

U.S. PATENT DOCUMENTS

2011/0265847 A1 11/2011 Peng et al.
2014/0141559 A1 5/2014 Luch et al.

FOREIGN PATENT DOCUMENTS

| CN | 103474485 A | 12/2013 |
| CN | 108231936 A | 6/2018 |
| JP | H06268241 A | 9/1994 |

OTHER PUBLICATIONS

Martin Ebrhardt, et al., Fabrication of contact holes by rear side laser ablation of polyilnide foils for CIGS solar modules, Applied Surface Science, 2013, pp. 219-222, vol. 278.

* cited by examiner

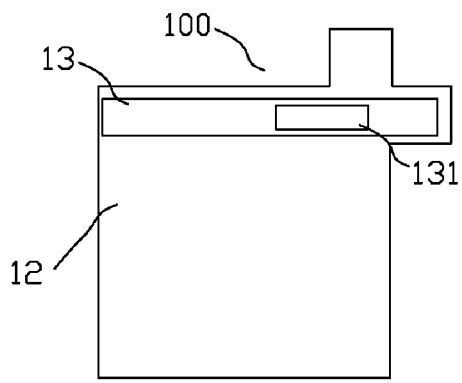 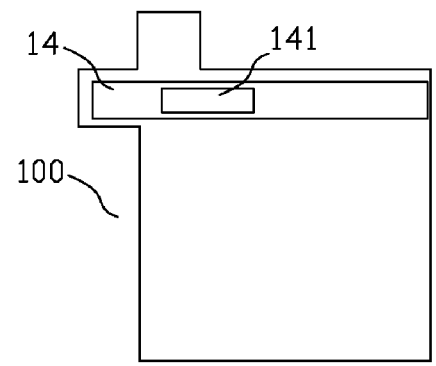
FIG. 3a FIG. 3b
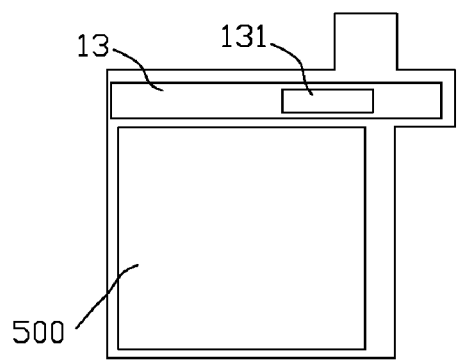 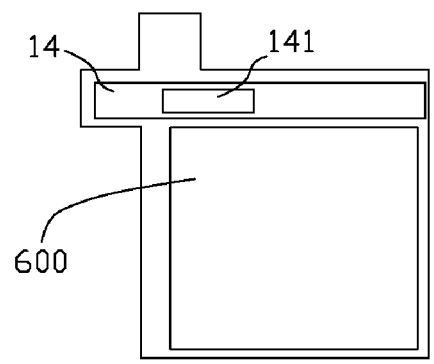
FIG. 4a FIG. 4b

FLEXIBLE PHOTOELECTRIC DEVICE MODULE AND METHOD FOR MANUFACTURING SAME

CROSS REFERENCE TO THE RELATED APPLICATIONS

This application is the national phase entry of International Application No. PCT/CN2021/141442, filed on Dec. 27, 2021, which is based upon and claims priority to Chinese Patent Application No. 202011584469.6, filed on Dec. 28, 2020; and Chinese Patent Application No. 202111576832.4, filed on Dec. 21, 2021, the entire contents of which are incorporated herein by reference.

TECHNICAL FIELD

The present disclosure relates to a photoelectric device, specifically to a flexible photoelectric device module and a method for manufacturing same.

BACKGROUND

A flexible photoelectric device, such as an organic solar battery, has attracted widespread attention due to its advantages of softness, semitransparency, inexpensive large-area printing preparation and the like. In recent years, with the unremitting efforts of scientists, the photoelectric conversion efficiency of rigid and flexible organic solar batteries have reached 18% and 14% respectively, which basically meet the commercialization requirements. However, in order to truly achieve the commercial application of organic solar batteries, it is necessary to achieve preparation of large-area modules, ensuring less sacrifice of their photoelectric conversion efficiency.

A flexible organic solar battery is taken as an example. Due to poor conductivity of a transparent base electrode (such as an indium tin oxide (ITO) and a silver nanowire), when an area of the flexible organic solar battery is enlarged, a surface resistance of the battery is bound to increase. Various serial and parallel structural designs will not only increase the series resistance of a device, but also reduce an effective area of a battery module, which will eventually lead to a great decrease in the performance of an organic solar battery of a large module. A currently reported rigid organic solar module (200 $cm^2$) has the highest efficiency of 11.7%, while a large-area flexible module has lower battery efficiency.

On the other hand, at present, a large-area flexible photoelectric device module is mainly achieved by roll-to-roll printing of a large-area battery to design a serial-parallel structure in combination with a base electrode circuit. The disadvantages are as follows: I, designing various complicated circuits on a base will increase the preparation difficulty and cost; II, longer circuits on the base will increase the series resistance and reduce the photoelectric conversion efficiency of the battery; and III, designing serial-parallel structures for connection of various complicated lines will reduce an extremely large effective area of a device, resulting in waste.

SUMMARY

The present disclosure mainly aims to provide a flexible photoelectric device module and a method for manufacturing same, so as to overcome the shortcomings in the prior art.

In order to achieve the foregoing invention objective, the technical solution used by the present disclosure includes:

An embodiment of the present disclosure provides a flexible photoelectric device module, including at least two photoelectric device units. One photoelectric device unit includes a bottom electrode, a functional layer and a top electrode which are disposed in sequence along a setting direction; the bottom electrode includes a light-transmittance insulating base; a first electrode and a second electrode which are arranged on a first surface of the light-transmittance insulating base; and a third electrode arranged on a second surface of the light-transmittance insulating base; the first surface and the second surface are disposed facing away from each other; the first electrode is a transparent electrode; the second electrode is in electric contact with the first electrode; the second electrode is electrically connected to the third electrode through a conducting channel; the conducting channel includes a through hole running through the light-transmittance insulating base along a thickness direction, and a conductor arranged in the through hole; and furthermore, the third electrode in one photoelectric device unit is electrically connected to the top electrode or the first electrode in the other photoelectric device unit, so that the two photoelectric device units are connected in series or in parallel.

In some implementations, a window matched with the through hole is also formed in the second electrode and/or the third electrode, and conducting slurry or metal that is used for forming the conductor can fill the through hole through the window.

An embodiment of the present disclosure also provides a flexible photoelectric device module, including two photoelectric device units. One photoelectric device unit includes a bottom electrode, a functional layer and a top electrode which are disposed in sequence along a setting direction; the bottom electrode includes a first electrode arranged on a first surface of a light-transmittance insulating base; a conducting channel is formed in the light-transmittance insulating base; the conducting channel includes a through hole running through the light-transmittance insulating base along a thickness direction, and a conductor arranged in the through hole; and by means of the conducting channel, the first electrode is electrically connected to the top electrode or the bottom electrode of the other photoelectric device unit that is coupled to a second surface of the light-transmittance insulating base, so that the two photoelectric device units are connected in series or in parallel. The first surface and the second surface are disposed facing away from each other.

An embodiment of the present disclosure provides a method for manufacturing the flexible photoelectric device module, including:

respectively manufacturing at least two photoelectric device units, and connecting the at least two photoelectric device units in series and/or in parallel.

The method for manufacturing the photoelectric device units includes a step of manufacturing a bottom electrode, a functional layer and a top electrode in sequence on a first surface of a light-transmittance insulating base.

Further, the step of manufacturing the bottom electrode specifically includes:

disposing a first electrode and a second electrode on the first surface of the light-transmittance insulating base, and controlling the second electrode and the first electrode to be in electric contact with each other;

disposing a third electrode on a second surface of the light-transmittance insulating base that faces away from the first surface;

machining regions, which correspond to the second electrode and the third electrode, on the light-transmittance insulating base to form at least one through hole that runs through the light-transmittance insulating base along a thickness direction; and when conducting slurry is applied to or metal is deposited on the first surface or second surface of the light-transmittance insulating base, and at least part of the conducting slurry or metal fills the through hole and forms a conductor, forming a conducting channel that runs through the electrode.

In some implementations, the manufacturing method includes:

forming the through hole in a region, which corresponds to a second electrode and a third electrode, on the light-transmittance insulating base of one photoelectric device unit;

disposing the second electrode and the third electrode on a first surface and a second surface of the light-transmittance insulating base, and forming a window matched with the through hole in any one of the second electrode and the third electrode;

putting the manufactured photoelectric device unit into a positioning template;

applying conducting slurry to or depositing metal at the window on the second electrode and/or the third electrode of the photoelectric device unit, and filling the corresponding through hole with part of the conducting slurry or metal to form the conducting channel; and fitting the photoelectric device unit to the other photoelectric device unit using the conducting slurry left on the second electrode and/or the third electrode, and electrically connecting the third electrode in the photoelectric device unit to the top electrode or the first electrode in the other photoelectric device unit through the conducting slurry.

An embodiment of the present disclosure provides a method for manufacturing the flexible photoelectric device module, including:

respectively manufacturing at least two photoelectric device units, and connecting the at least two photoelectric device units in series and/or in parallel.

The method for manufacturing the photoelectric device units includes a step of manufacturing a bottom electrode, a functional layer and a top electrode in sequence on a first surface of a light-transmittance insulating base.

Further, the step of manufacturing the bottom electrode specifically includes:

disposing a first electrode on the first surface of the light-transmittance insulating base;

machining a region, which corresponds to the first electrode, on the light-transmittance insulating base to form at least one through hole that runs through the light-transmittance insulating base along a thickness direction; and when conducting slurry is applied to or metal is deposited on the first surface or second surface of the light-transmittance insulating base, and at least part of the conducting slurry or metal fills the through hole and forms a conductor, forming a conducting channel that runs through the light-transmittance insulating base, where the conducting channel is electrically connected to the first electrode.

In some implementations, the conducting slurry includes silver paste or a conductive adhesive, and the conductive adhesive is preferred.

In some implementations, the metal may be deposited into the through hole by means of magnetron sputtering and evaporation to form the conductor.

Compared with the prior art, the technical solutions of the embodiments of the present disclosure can greatly simplify the process for manufacturing a large-area flexible organic solar battery module to reduce the cost, and can also significantly improve the utilization rate of an effective area of a flexible organic solar battery module and reduce the loss of the photoelectric conversion efficiency of the flexible organic solar battery module.

BRIEF DESCRIPTION OF THE DRAWINGS

In order to explain the technical solutions of the implementations of the present disclosure more clearly, the following will briefly introduce the accompanying drawings used in the embodiments of the present disclosure. It should be understood that the drawings in the following description only illustrate some embodiments of the present disclosure and thus shall not be deemed as limiting the scope. Those of ordinary skill in the art can obtain other related drawings based on these drawings without creative work.

FIG. 3A and FIG. 3B are respectively a top view and a bottom view of a bottom electrode 100 in a battery unit U in a typical embodiment of the present disclosure;

FIG. 4A and FIG. 4B are respectively a top view and a bottom view of a battery unit U in a typical embodiment of the present disclosure;

DETAILED DESCRIPTION OF THE EMBODIMENTS

Figure 1:
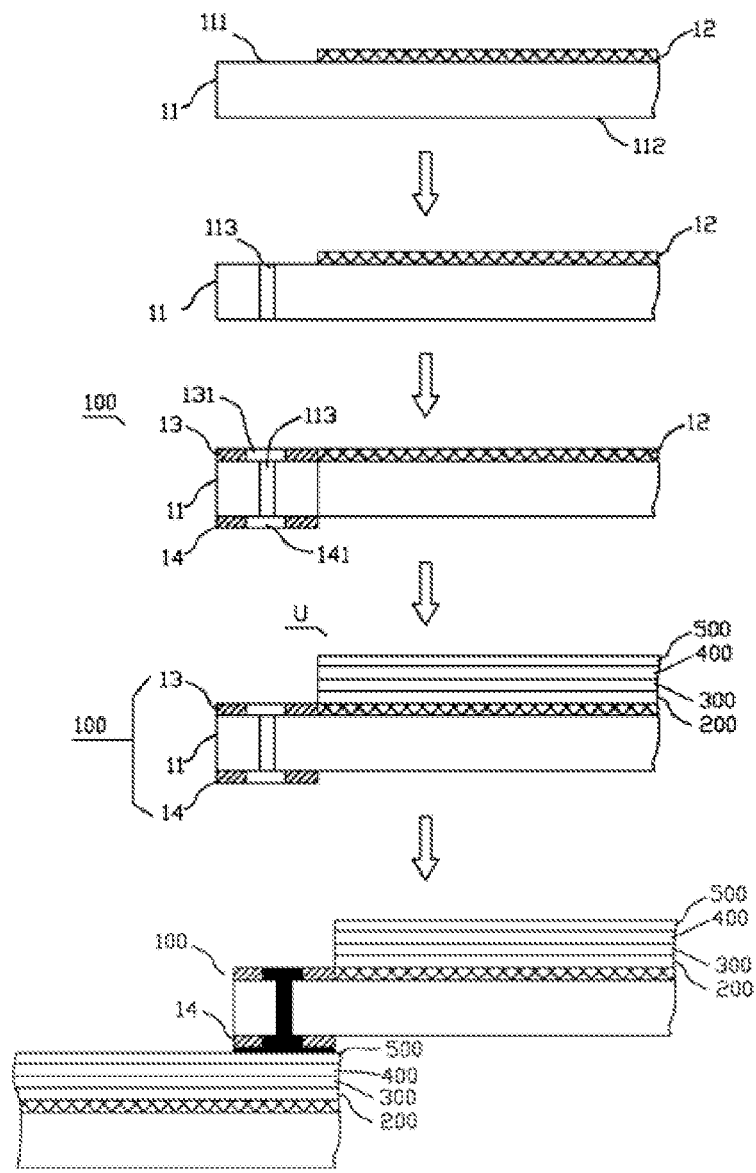
FIG. 1 is a schematic diagram of a process for manufacturing a first kind of flexible organic solar battery module in a typical embodiment of the present disclosure.

It should be noted that the following detailed description is exemplary and intended to provide a further explanation of the present disclosure. Unless otherwise specified, all technical and scientific terms used in this specification have the same meaning as commonly understood by a person of ordinary skill in the art to which the present disclosure belongs.

It should be noted that terms used herein are only for describing specific implementations and are not intended to limit exemplary implementations according to the present disclosure. As used herein, unless the context clearly dictates otherwise, the singular is intended to include the plural as well. Furthermore, it should also be understood that when the terms "contain" and/or "include" are used in this specification, it indicates that there are features, steps, operations, devices, components and/or combinations thereof.

One aspect of an embodiment of the present disclosure provides a flexible photoelectric device module, including at least two photoelectric device units. Each photoelectric device unit includes a bottom electrode, a functional layer and a top electrode which are disposed in sequence along a setting direction; the bottom electrode includes a light-transmittance insulating base; a first electrode and a second electrode which are arranged on a first surface of the light-transmittance insulating base; and a third electrode arranged on a second surface of the light-transmittance insulating base; the first surface and the second surface are disposed facing away from each other; the first electrode is a transparent electrode; the second electrode is in electric contact with the first electrode; the second electrode is electrically connected to the third electrode through a conducting channel; the conducting channel includes a through hole running through the light-transmittance insulating base along a thickness direction, and a conductor arranged in the through hole; and furthermore, the third electrode in one photoelectric device unit is electrically connected to the top electrode or the first electrode in the other photoelectric device unit, so that the two photoelectric device units are connected in series or in parallel.

In some implementations, there is one or more second electrodes. At least a partial region of the one or more second electrodes is covered by the first electrode, and/or, at least a partial region of the one or more second electrodes covers the first electrode, and/or, the one or more second electrodes are distributed around the first electrode, and/or, at least a partial region of the one or more second electrodes is encircled by the first electrode.

In some implementations, the second electrodes surround or half surround the first electrode.

In some implementations, the entire second electrode is a frame (the shape of the frame includes, but is not limited to, a circle, a square and other regular shapes or other irregular shapes), and an inside edge of the frame is in continuously electric contact with the first electrode. As such, the second electrode with lower resistance is arranged at a periphery of the first electrode (a transparent electrode) and serves as a conducting path, so that due to the specific "short-circuit effect" of a circuit, a low-cost and high-performance "highway" can be provided for a large-area transparent electrode without changing the conductivity of the transparent electrode itself, thus effectively improving the overall performance (including but not limited to the charge collection efficiency) of a product.

Further, the functional layer is formed on the first electrode.

In some implementations, the second electrode is a conducting wire.

Further, the conducting wire has a width of less than or equal to 5 mm, preferably less than or equal to 1 mm.

Further, compared with the first electrode, the second electrode has a protrusion height of less than 5 um, preferably less than 1 um, at the highest point.

Further, an equivalent square resistance of the conducting wire is less than or equal to 5 Ω/sq, preferably less than or equal to 1 Ω/sq.

In some implementations, the partial region of the one or more second electrodes is stacked on the first electrode.

In some implementations, the through hole continuously runs through the light-transmittance insulating base and the second electrode and/or the third electrode along the setting direction.

In some implementations, the conductor is formed by conducting slurry that fills the through hole.

In some implementations, the conducting slurry includes silver paste or a conductive adhesive, or may also be a proper type of conducting ink known in the field or fluid containing a conducting substance. The conductive adhesive is preferred.

In some implementations, a window matched with the through hole is also formed in the second electrode and/or the third electrode, and the conducting slurry or deposited metal that is used for forming the conductor can fill the through hole through the window.

Further, an area of the window is larger than an area of an opening of the through hole in the first surface or the second surface.

In some implementations, both of the second electrode and the third electrode are provided with the windows.

In some implementations, the transparent electrode includes, but is not limited to, a silver nanowire electrode, ITO, AZO, a carbon nano tube film, a graphene film, a PEDOT:PSS film.

In some implementations, the light-transmittance insulating base may be made of an organic, inorganic or organic/inorganic composite material. For example, it may be a flexible transparent film made of polyethylene terephthalate (PET), polyurethane (PU), polyimide (PI) and the like.

In some implementations, the second electrode and the third electrode include any one or a combination of more of a metal electrode, a conducting polymer electrode and a metal oxide electrode, and are not limited to these. For example, they may be formed by all kinds of highly conductive metals such as Au, Ag and Cu.

In some implementations, the second surface of the light-transmittance insulating base in one photoelectric device unit is also connected to the top electrode or the bottom electrode in the other photoelectric device unit through a conductive adhesive layer.

In some implementations, the flexible photoelectric device module includes a flexible film light-emitting diode, a flexible film photovoltaic battery or a flexible film photoelectric detector, but it is not limited to this.

A flexible film solar battery is taken as an example, and its functional layer may be an active layer. The flexible film solar battery may also include an electron transfer layer, a hole transfer layer, an interface modifier layer and the like. Materials of these structural layers may be known in the art.

The flexible film light-emitting diode is taken as an example, and its functional layer may be a light-emitting layer.

Another aspect of an embodiment of the present disclosure provides a method for manufacturing the flexible photoelectric device module, including:

respectively manufacturing at least two photoelectric device units, and connecting the at least two photoelectric device units in series and/or in parallel.

The method for manufacturing the photoelectric device units includes a step of manufacturing a bottom electrode, a functional layer and a top electrode in sequence on a first surface of a light-transmittance insulating base.

Further, the step of manufacturing the bottom electrode specifically includes:

disposing a first electrode and a second electrode on the first surface of the light-transmittance insulating base, and controlling the second electrode and the first electrode to be in electric contact with each other;

disposing a third electrode on a second surface of the light-transmittance insulating base that faces away from the first surface;

machining regions, which correspond to the second electrode and the third electrode, on the light-transmittance insulating base to form at least one through hole that runs through the light-transmittance insulating base along a thickness direction;

when conducting slurry is applied to or metal is deposited on the first surface or second surface of the light-transmittance insulating base, and at least part of the conducting slurry or metal fills the through hole and forms a conductor, forming a conducting channel that runs through the electrode.

In some implementations, the step of manufacturing the bottom electrode specifically includes: disposing a second electrode on the first surface of the light-transmittance insulating base and/or disposing a third electrode on the second surface of the light-transmittance insulating base, and machining the second electrode and/or the third electrode and the light-transmittance insulating base to form the through hole that continuously runs through the second electrode and/or the third electrode and the light-transmittance insulating base.

In some implementations, the step of manufacturing the bottom electrode specifically includes:

forming the through hole in a region, which corresponds to a second electrode and a third electrode, on the light-transmittance insulating base;

disposing the second electrode and the third electrode on a first surface and a second surface of the light-transmittance insulating base, and forming a window matched with the through hole in any one of the second electrode and the third electrode; and when conducting slurry is applied to or metal is deposited at the window of the second electrode and/or the third electrode, and at least part of the conducting slurry or metal fills the through hole and forms a conductor, forming a conducting channel.

The operation of machining and forming the through hole on the light-transmittance insulating base can be carried out before or after the operation of disposing the second electrode and the third electrode on the light-transmittance insulating base.

For example, the through hole may be first machined and formed on the light-transmittance insulating base before the second electrode and the third electrode which have the windows are arranged on the light-transmittance insulating base.

Or, the second electrode and the third electrode which have the windows may be first arranged on the light-transmittance insulating base before the through hole is machined and formed on the light-transmittance insulating base.

In some implementations, the step of manufacturing the bottom electrode specifically includes: forming windows matched with the through hole in both the second electrode and the third electrode.

In some implementations, the manufacturing method specifically includes:

putting each manufactured photoelectric device unit into a positioning template;

applying conducting slurry to or depositing metal at the window on the second electrode and/or the third electrode of the photoelectric device unit, and filling the corresponding through hole with part of the conducting slurry or metal to form the conducting channel; and fitting the photoelectric device unit to the other photoelectric device unit using the conducting slurry left on the second electrode and/or the third electrode, and electrically connecting the third electrode in the photoelectric device unit to the top electrode or the first electrode in the other photoelectric device unit through the conducting slurry.

In the foregoing implementation, the conducting slurry can fill the through hole by itself under the action of the gravity, or the conducting slurry or the deposited metal can fill the through hole under the action of other external forces.

In the foregoing implementation, the method for machining the through hole in the light-transmittance insulating base or in the light-transmittance insulating base and the second electrode and/or the third electrode may be known. For example, it may be machining, laser ablation or other physical and chemical methods. If the machining or laser ablation method is adopted, in most cases, an annular bulge may be possibly formed at an edge of the machined through hole.

Further, the shape and size of the through hole may be randomly selected according to an actual requirement. For example, the through hole may be circular, polygonal or in other irregular shapes.

In some implementations, an area of an opening of the through hole on the first surface or the second surface of the light-transmittance insulating base is smaller than 0.13 mm$^2$, preferably smaller than 0.03 mm$^2$.

In some implementations, a perimeter of the opening of the through hole on the first surface or the second surface of the light-transmittance insulating base is 10 to 800 μm, preferably 60 to 400 um.

In some implementations, an edge part of the opening of the through hole on the first surface or the second surface of the light-transmittance insulating base has a protrusion height relative to the first surface or the second surface is less than 5 um, preferably less than 1 um.

In some implementations, the conducting slurry includes silver paste, a conductive adhesive, a proper type of conducting ink known in the art, or other fluids containing conducting substances. When the conducting slurry is under a certain condition (such as heating, natural drying or light irradiation), some volatile constituents (such as a solvent and a diluent) in the conducting slurry will be volatilized and removed, or undergo quick crosslinking reaction due to the light irradiation, so that the conducting slurry is turned into a conducting solid (that is, the foregoing conductor). Or, some constituents in the conducting slurry may possibly react with a substance in an environment or other constituents in the conducting slurry, so that the conducting slurry is turned into the foregoing conductor.

In some implementations, the viscosity of the conducting slurry is 20 to 100,000 cP, preferably 100 to 10,000 cP.

In some implementations, the method for applying the conducting slurry to the light-transmittance insulating base or to the light-transmittance insulating base and the second electrode and/or the third electrode includes any one of or a combination of various of printing, coating or adhesive dispensing, but is not limited to this.

In some implementations, the second electrode and the third electrode may be formed on the light-transmittance insulating base by means of physical deposition and/or chemical deposition. For example, the method is any one of or a combination of various of printing, coating, adhesive dispensing, vacuum evaporation or magnetron sputtering, but is not limited to this. More specifically, for example, the second electrode and the third electrode may be manufactured and formed using any one of the following methods: ink-jet printing, air jet printing, photogravure, silk-screen printing, flexography and mask spraying.

in some other implementations, the second electrode and the third electrode may also be pre-manufactured and then are fixed on the light-transmittance insulating base.

In some implementations, thicknesses of the second electrode and the third electrode are respectively greater than the protrusion heights, relative to the first surface and the second surface, of the edge parts of the openings of the through hole on the first surface and the second surface of the light-transmittance insulating base.

In some implementations, the second electrode and the third electrode respectively cover the openings of the through hole on the first surface and the second surface of the light-transmittance insulating base and outwards extend from the edge parts of the openings along a radial direction by 20 um or above, preferably 50 um.

In some implementations, a material of the second electrode and the third electrode includes all kinds of well-conductive metal or non-metal materials such as Au, Ag and Cu.

In some implementations, the method also includes: connecting the second surface of the light-transmittance insulating base in one photoelectric device unit to the top electrode or the bottom electrode in the other photoelectric device unit through a conductive adhesive layer.

In the above implementations of the present disclosure, a plurality of photoelectric device units can be easily and quickly connected in series or in parallel using a conductive adhesive by forming a conducting channel and disposing the second electrode and the third electrode in the light-transmittance insulating base, thus effectively simplifying the process for preparing this kind of flexible photoelectric device module (particularly a large-area module), and reducing the manufacturing cost of the flexible photoelectric device module. Furthermore, an area of a module is enlarged without reducing the effective area of a device. The photoelectric conversion efficiency can also be ensured and even improved.

Another aspect of an embodiment of the present disclosure provides a flexible photoelectric device module, including two photoelectric device units. One photoelectric device unit includes a bottom electrode, a functional layer and a top electrode which are disposed in sequence along a setting direction; the bottom electrode includes a first electrode arranged on a first surface of a light-transmittance insulating base; a conducting channel is formed in the light-transmittance insulating base; the conducting channel includes a through hole running through the light-transmittance insulating base along a thickness direction, and a conductor arranged in the through hole; and by means of the conducting channel, the first electrode is electrically connected to the top electrode or the bottom electrode of the other photoelectric device unit that is coupled to a second surface of the light-transmittance insulating base, so that the two photoelectric device units are connected in series or in parallel. The first surface and the second surface are disposed facing away from each other.

In some implementations, the first surface of the light-transmittance insulating base is also provided with a fourth electrode which is in electric contact with the first electrode.

In some implementations, the first electrode covers the entire first surface of the light-transmittance insulating base. A material of the first electrode is as mentioned above, and will not be repeatedly described.

At least a partial region of the fourth electrode covers the first electrode, or, at least a partial region of the first electrode covers the fourth electrode. That is, the first electrode and the fourth electrode may overlap, or, the first electrode covers the fourth electrode, or, the fourth electrode is arranged on the first electrode. The fourth electrode may adopt the foregoing conducting wire. Further, the fourth electrode may also achieve a function similar to that of the foregoing second electrode.

In some implementations, the second surface of the light-transmittance insulating base is also provided with a fifth electrode which is electrically connected to the first electrode through the conducting channel. A material and the like of the fifth electrode may be similar to those of the foregoing third electrode.

In some implementations, the conductor is formed by conducting slurry that fills the through hole. The material of the conducting slurry is as mentioned above.

In some implementations, a sixth electrode formed by the conducting slurry or deposited metal is also arranged on the first electrode, and the sixth electrode and the conductor are integrally formed. The sixth electrode may be in a form of the foregoing conducting wire. Further, the sixth electrode may also achieve a function similar to that of the foregoing second electrode and fourth electrode.

In some implementations, the second surface of the light-transmittance insulating base in one photoelectric device unit is connected to the top electrode or the bottom electrode in the other photoelectric device unit through a conductive adhesive layer.

In the foregoing implementations, the photoelectric device unit may be various types of solar battery devices. The functional layer includes upright, inverted and multi-interface modified organic film photovoltaic devices, a laminated quantum dot device, a perovskite photovoltaic device or other types of laminated batteries, and is not limited to this.

A further aspect of an embodiment of the present disclosure provides a method for manufacturing the flexible photoelectric device module, including:

respectively manufacturing at least two photoelectric device units, and connecting the at least two photoelectric device units in series and/or in parallel.

The method for manufacturing the photoelectric device units includes a step of manufacturing a bottom electrode, a functional layer and a top electrode in sequence on a first surface of a light-transmittance insulating base.

Further, the step of manufacturing the bottom electrode specifically includes:

disposing a first electrode on the first surface of the light-transmittance insulating base;

machining a region, which corresponds to the first electrode, on the light-transmittance insulating base to form at least one through hole that runs through the light-transmittance insulating base along a thickness direction; and when conducting slurry is applied to or metal is deposited on the first surface or second surface of the light-transmittance insulating base, and at least part of the conducting slurry or metal fills the through hole and forms a conductor, forming a conducting channel that runs through the light-transmittance insulating base, where the conducting channel is electrically connected to the first electrode.

Further, the method may also include a step of manufacturing a fourth electrode or a sixth electrode on the first electrode of the light-transmittance insulating base, and/or, a step of manufacturing a fifth electrode on the second surface of the light-transmittance insulating base. The corresponding operations may refer to the above-mentioned method for manufacturing the second electrode and the third electrode, and will not be repeatedly described.

Referring to FIG. 1, in a typical embodiment of the present disclosure, a method for manufacturing a first kind of flexible organic solar battery module includes:

S1: manufacturing and forming a continuous transparent electrode 12 (which is defined as a first electrode) on a first surface 111 of a flexible light-transmittance insulating base 11;

S2: machining one or more through holes 113 in a selected region on the flexible light-transmittance insulating base 11, where each through hole 113 runs through the flexible light-transmittance insulating base 11 along a thickness direction, and the selected region may be an edge region or other suitable regions of the flexible light-transmittance insulating base 11, on which the transparent electrode 12 is or is not distributed;

S3: respectively manufacturing a second electrode 13 and a third electrode 14 on the first surface 111 and a second surface 112 of the flexible light-transmittance insulating base 11 by means of printing, coating, adhesive dispensing, vacuum evaporation or magnetron sputtering, where windows 131 and 141 corresponding to the through holes 113 are formed in both the second electrode 13 and the third electrode 14, thus forming a bottom electrode 100 of one battery unit;

S4: manufacturing an electron transfer layer 200, an active layer 300, a hole transfer layer 400 and a top electrode 500 in sequence on the transparent electrode 12 of the bottom electrode 100 by a method known in the art, thus forming an intact battery unit U;

S5: applying a proper amount of conductive paste to the second electrode 13 and the third electrode 14 (particularly the windows 131 and 141) of one battery unit, and filling the through holes 113 with part of the conductive paste, thus forming a conducting channel 15 between the second electrode 13 and the third electrode 14;

S6: fitting the battery unit to another battery unit, and adhering the third electrode 14 of the battery unit to the top electrode 500 of another battery unit using the conductive paste left on the foregoing third electrode 14 so that the two battery units are disposed in series; and S7: repeating the operation of the foregoing step S6 until a plurality of battery units are fitted to form the desired flexible organic solar battery module.

Further, the operations of the foregoing step S1 to step S7 may be performed in a glove box or other clean, water-free, and oxygen-free environments.

Further, the operation of the foregoing step S6 may be performed by virtue of an auxiliary jig such as a positioning template.

Further, in the foregoing step S6, the third electrode 14 of one battery unit may also be adhered and electrically connected to the top electrode 500 of another battery unit through a conductive adhesive layer.

Figure 2:
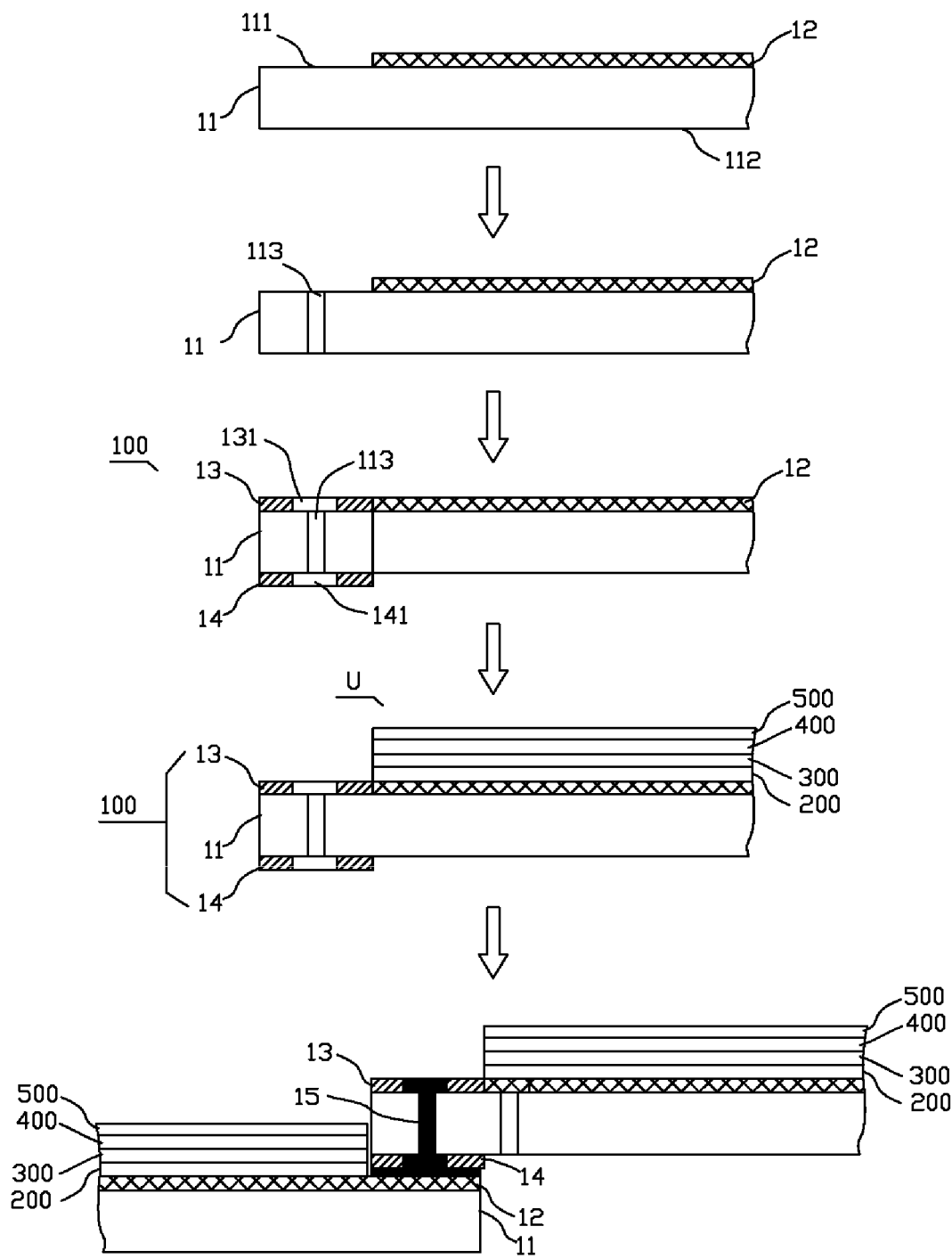
FIG. 2 is a schematic diagram of a process for manufacturing a second kind of flexible organic solar battery module in a typical embodiment of the present disclosure.

Further, referring to FIG. 2, a method for manufacturing a second kind of flexible organic solar battery module in a typical embodiment of the present disclosure is similar to that of FIG. 1. However, in the step S6, the third electrode 14 of the battery unit can be adhered to the first electrode 12 of another battery unit using the conductive paste left on the third electrode 14, so that the two battery units are disposed in parallel.

Further, the manufacturing method may also include an operation of further packaging the formed flexible organic solar battery module. These operations can all be implemented according to the method known in the art.

Further, in this typical embodiment, the top view and the bottom view of the bottom electrode 100 in one battery unit U can respectively refer to FIG. 3A to FIG. 3B.

Further, in this typical embodiment, the top view and the bottom view of one battery unit U can respectively refer to FIG. 4A to FIG. 4B (600 refers to an effective area of a battery).

Figure 5A:
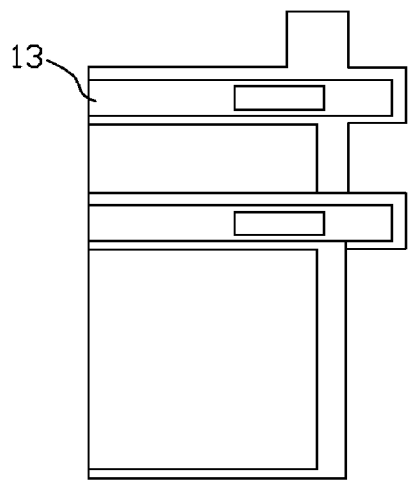
FIG. 5A and FIG. 5B are respectively a top view and a bottom view of a device structure formed by a plurality of battery units connected in series in a typical embodiment of the present disclosure.
Figure 5B:
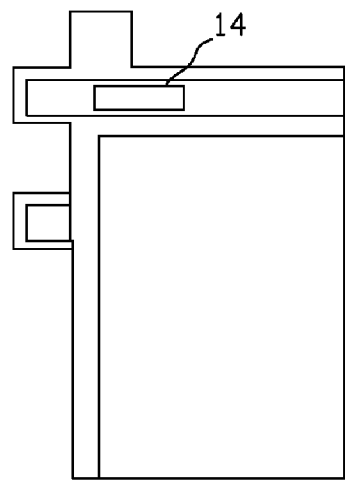

Further, in this typical embodiment, the top view and the bottom view of a module structure formed by a plurality of battery units connected in series can respectively refer to FIG. 5A to FIG. 5B.

Figure 6A:
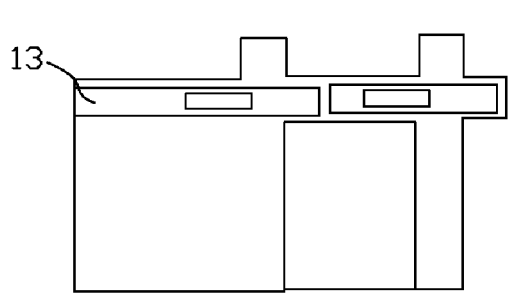
FIG. 6A and FIG. 6B are respectively a top view and a bottom view of a device structure formed by a plurality of battery units connected in parallel in a typical embodiment of the present disclosure.
Figure 6B:
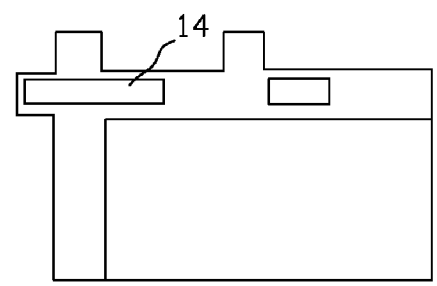

Further, in this typical embodiment, the top view and the bottom view of a module structure formed by a plurality of battery units connected in parallel can respectively refer to FIG. 6A to FIG. 6B.

Figure 9:
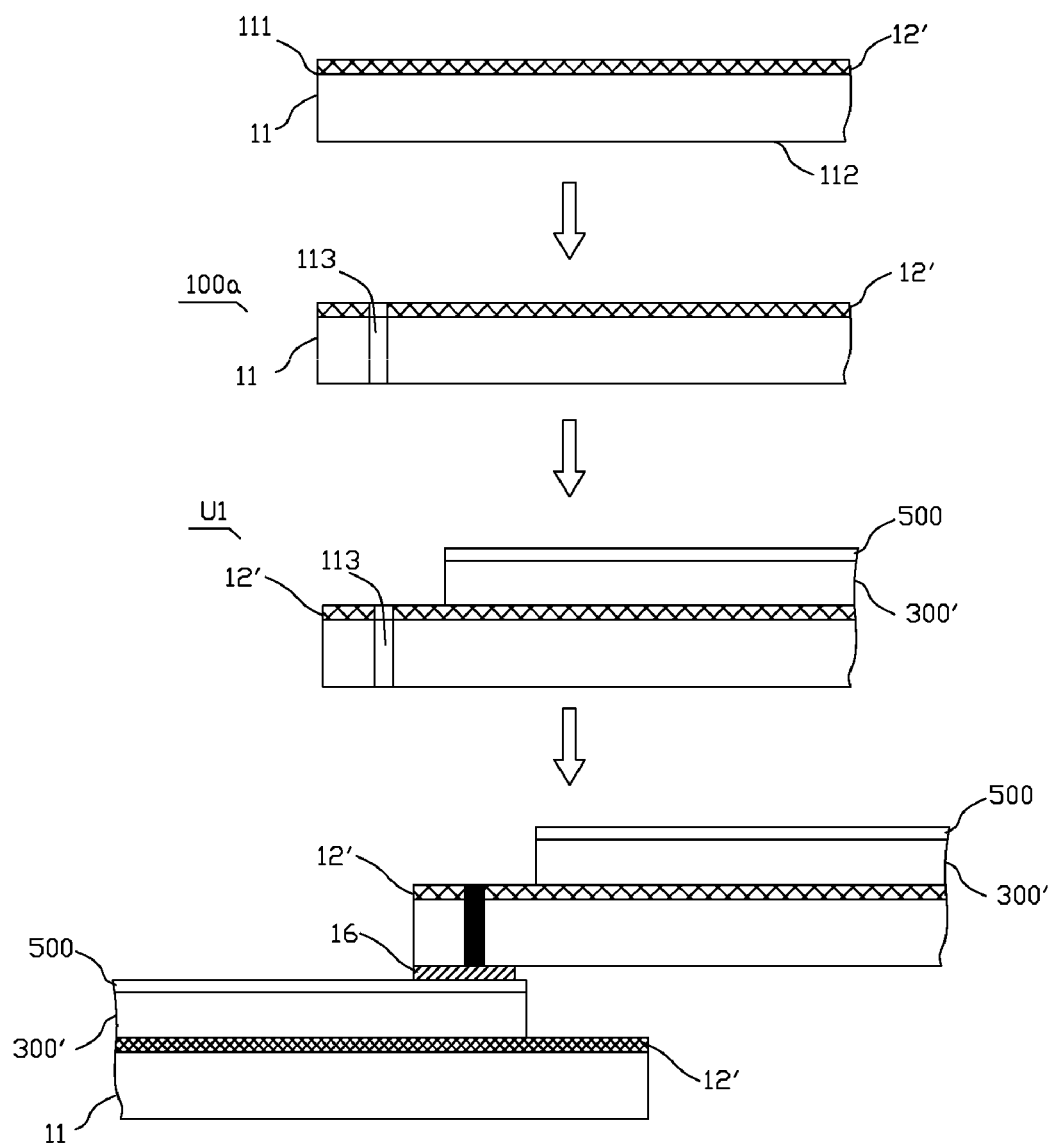
FIG. 9 is a schematic diagram of a process for manufacturing a third kind of flexible organic solar battery module in a typical embodiment of the present disclosure.

Referring to FIG. 9, in a typical embodiment of the present disclosure, a method for manufacturing a third kind of flexible organic solar battery module includes:

S1: manufacturing and forming a continuous transparent electrode 12' (which can also be defined as a first electrode) on a first surface 111 of a flexible light-transmittance insulating base 11;

S2: forming one or more through holes 113 in a selected region on the flexible light-transmittance insulating base 11, where each through hole 113 runs through the flexible light-transmittance insulating base 11 along a thickness direction, and the selected region may be an edge region or other suitable regions of the flexible light-transmittance insulating base 11, on which the transparent electrode 12' is distributed, thus manufacturing and forming a bottom electrode 100a of one battery unit;

S3: manufacturing a functional layer 300', a top electrode 500 and the like in sequence on the transparent electrode 12' of the bottom electrode 100a by a method known in the art, thus forming an intact battery unit U$_1$, where the functional layer 300' may include an electron transfer layer, a hole transfer layer and an active layer or a laminated battery;

S4: applying a proper amount of conductive paste or the like to the first surface or the second surface of the flexible light-transmittance insulating base 11 of one battery unit, and filling the through holes 113 with the conductive paste, thus forming a conducting channel 15; and S5: fitting the battery unit to another battery unit, adhering the second surface 112 of the flexible light-transmittance insulating base 11 to the top electrode 500 of another battery unit using a conductive adhesive layer 16, and electrically connecting the transparent electrode 12' in the battery unit to the top electrode of another battery unit through the conducting channel and the conductive adhesive layer 16 so that the two battery units are disposed in series, thus forming the desired flexible organic solar battery module.

Further, the operations of the foregoing step S1 to step S5 may be performed in a glove box or other clean, water-free, and oxygen-free environments. Furthermore, the operation of the foregoing step S5 may be performed by virtue of an auxiliary jig such as a positioning template.

Figure 10:
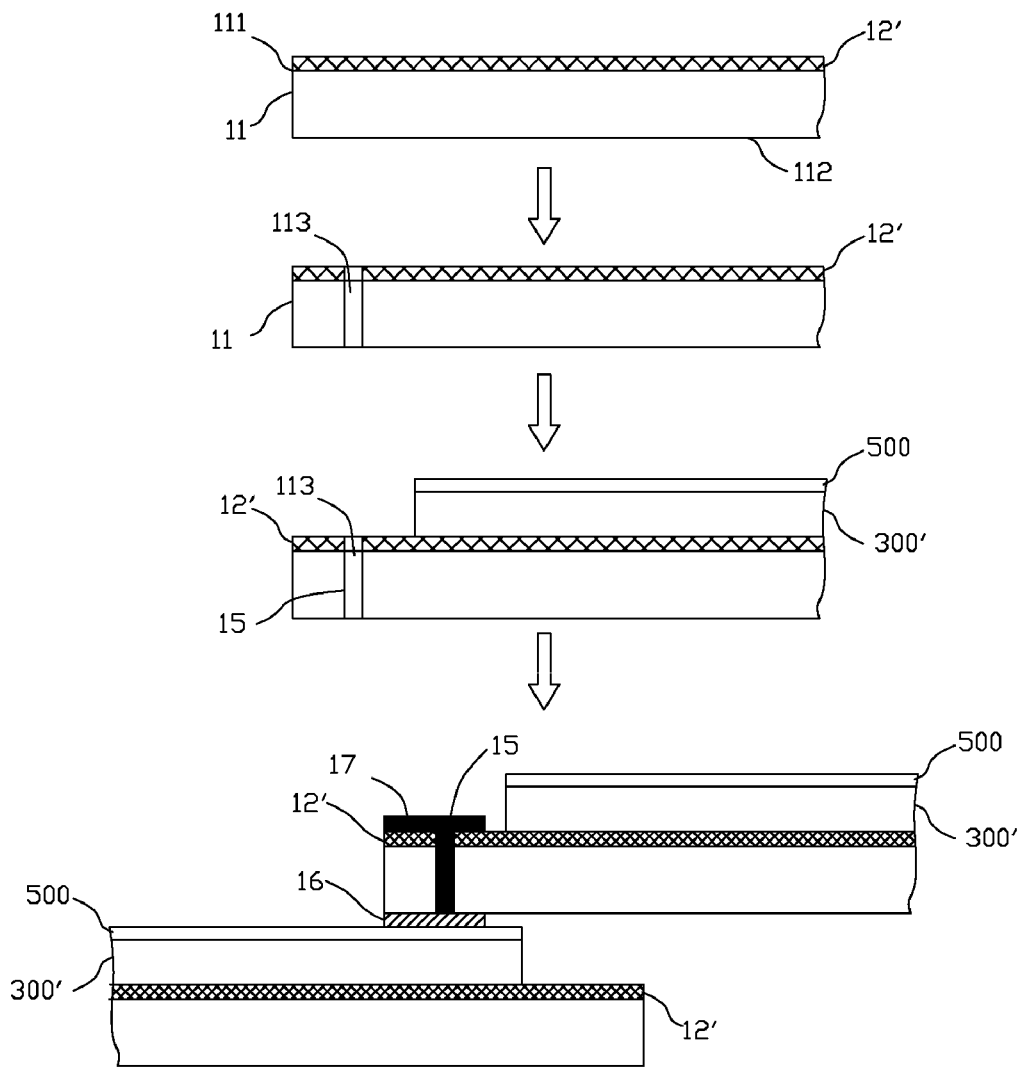
FIG. 10 is a schematic diagram of a process for manufacturing a fourth kind of flexible organic solar battery module in a typical embodiment of the present disclosure.

Referring to FIG. 10, in a typical embodiment of the present disclosure, a method for manufacturing a fourth kind of flexible organic solar battery module is similar to the method for manufacturing the third kind of flexible organic solar battery module. A difference mainly lies in the following:

S4: applying a proper amount of conductive paste or the like to the first surface of the flexible light-transmittance insulating base 11 of one battery unit, and filling the through holes 113 with part of the conductive paste to form a conducting channel 15, and forming a sixth electrode 17 on the transparent electrode 12' by the remaining conductive paste, where the sixth electrode 17 is a conducting wire.

Figure 11:
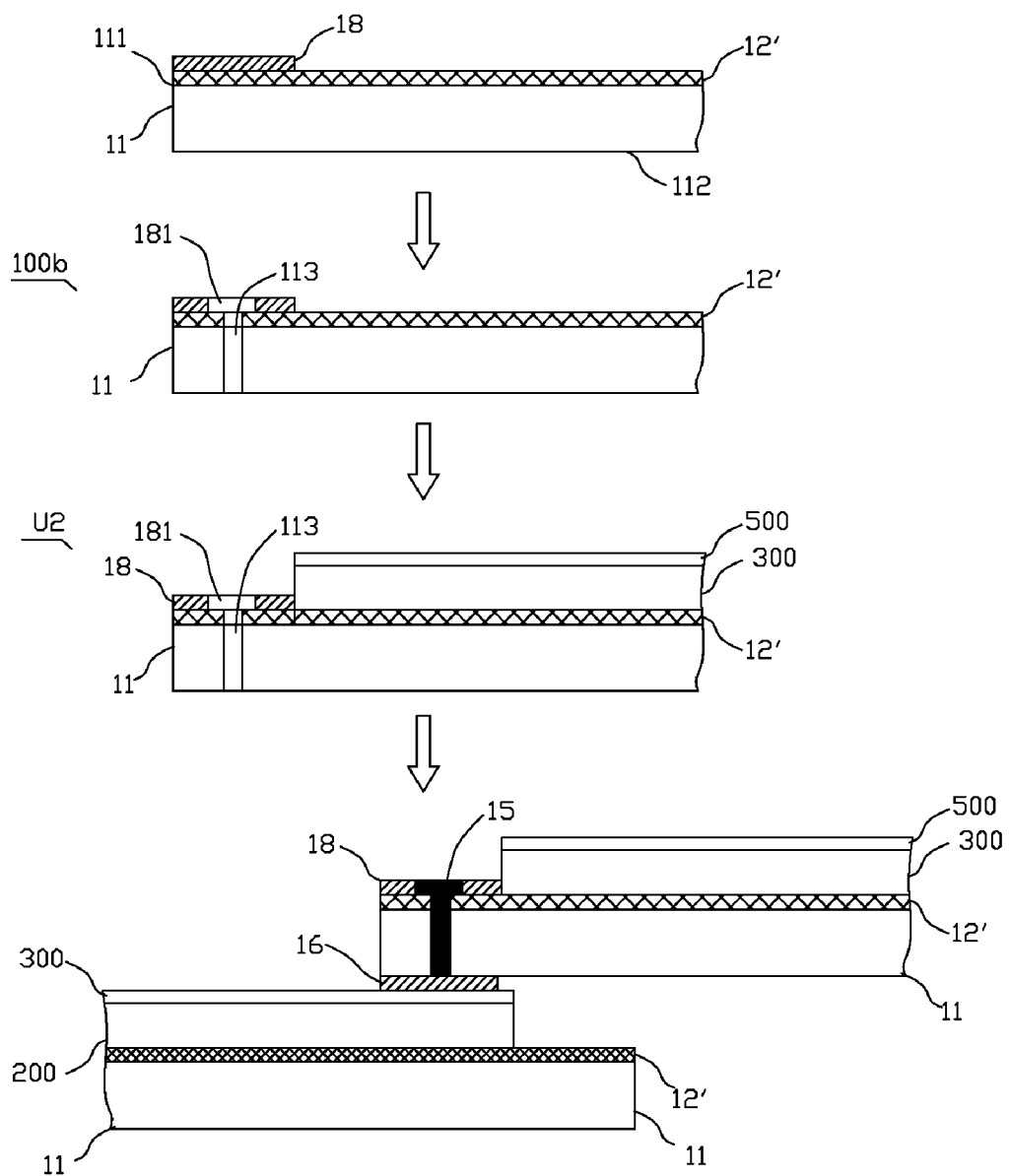
FIG. 11 is a schematic diagram of a process for manufacturing a fifth kind of flexible organic solar battery module in a typical embodiment of the present disclosure.

Referring to FIG. 11, in a typical embodiment of the present disclosure, a method for manufacturing a fifth kind of flexible organic solar battery module includes:

S1: manufacturing and forming a continuous transparent electrode 12' (which is defined as a first electrode) on a first surface 111 of a flexible light-transmittance insulating base 11;

S2: forming one or more through holes 113 in a selected region on the flexible light-transmittance insulating base 11, where each through hole 113 runs through the flexible light-transmittance insulating base 11 along a thickness direction, and the selected region may be an edge region or other suitable regions of the flexible light-transmittance insulating base 11, on which the transparent electrode 12' is distributed;

S3: manufacturing a fourth electrode 18 on the transparent electrode 12' by means of printing, coating, adhesive dispensing, vacuum evaporation or magnetron sputtering, where a window 181 corresponding to the through hole 113 is formed in the fourth electrode 18, thus forming a bottom electrode 100b of one battery unit;

S4: manufacturing a functional layer 300', a top electrode 500 and the like in sequence on the transparent electrode 12' of the bottom electrode 100b by a method known in the art, thus forming an intact battery unit U$_2$, where the functional layer 300' may include an electron transfer layer, a hole transfer layer and an active layer or a laminated battery;

S5: applying a proper amount of conductive paste or the like to the fourth electrode 18 (particularly the window 181) of one battery unit, and filling the through holes 113 with the conductive paste, thus forming a conducting channel 15; and S6: fitting the battery unit to another battery unit, adhering the second surface 112 of the flexible light-transmittance insulating base 11 to the top electrode 500 of another battery unit using a conductive adhesive layer 16, and electrically connecting the transparent electrode 12' and the fourth electrode 18 in the battery unit to the top electrode of another battery unit through the conducting channel 15 and the conductive adhesive layer 16 so that the two battery units are disposed in series, thus forming the desired flexible organic solar battery module.

Figure 12:
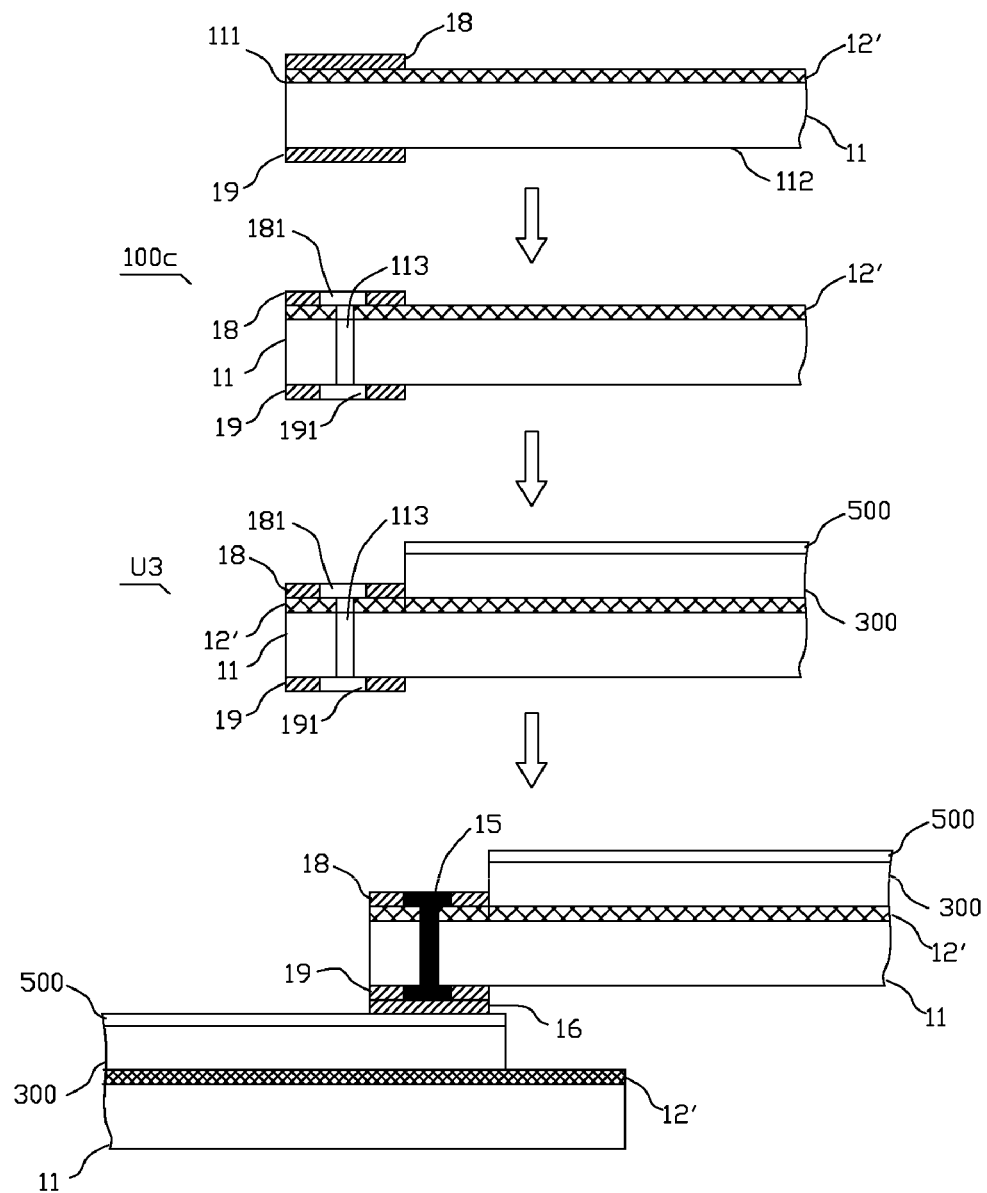
FIG. 12 is a schematic diagram of a process for manufacturing a sixth kind of flexible organic solar battery module in a typical embodiment of the present disclosure.

Referring to FIG. 12, in a typical embodiment of the present disclosure, a method for manufacturing a sixth kind of flexible organic solar battery module includes:

S1: manufacturing and forming a continuous transparent electrode 12' on a first surface 111 of a flexible light-transmittance insulating base 11;

S2: forming one or more through holes 113 in a selected region on the flexible light-transmittance insulating base 11, where each through hole 113 runs through the flexible light-transmittance insulating base 11 along a thickness direction, and the selected region may be an edge region or other suitable regions of the flexible light-transmittance insulating base 11, on which the transparent electrode 12' is distributed;

S3: manufacturing a fourth electrode 18 on the transparent electrode 12' by means of printing, coating, adhesive dispensing, vacuum evaporation or magnetron sputtering, and manufacturing a fifth electrode 19 on a second surface 112 of the flexible light-transmittance insulating base 11, where windows 181 and 191 corresponding to the through holes 113 are formed in both the fourth electrode 18 and the fifth electrode 19, thus forming a bottom electrode 100c of one battery unit;

S4: manufacturing a functional layer 300', a top electrode 500 and the like in sequence on the transparent electrode 12' of the bottom electrode 100c by a method known in the art, thus forming an intact battery unit U$_3$, where the functional layer 300' may include an electron transfer layer, a hole transfer layer and an active layer or a laminated battery;

S5: applying a proper amount of conductive paste to the fourth electrode 18 or the fifth electrode 19 (particularly the windows 181 and 191) of one battery unit, and filling the through holes 113 with the conductive paste, thus forming a conducting channel 15 between the fourth electrode 18 and the fifth electrode 19; and S6: fitting the battery unit to another battery unit, adhering the fifth surface 19 of the battery unit to the top electrode 500 of another battery unit using a conductive adhesive layer 16, and electrically connecting the transparent electrode 12' and the fourth electrode 18 in the battery unit to the top electrode of another battery unit through the conducting channel 15 and the conductive adhesive layer 16 so that the two battery units are disposed in series, thus forming the desired flexible organic solar battery module.

Figure 13:
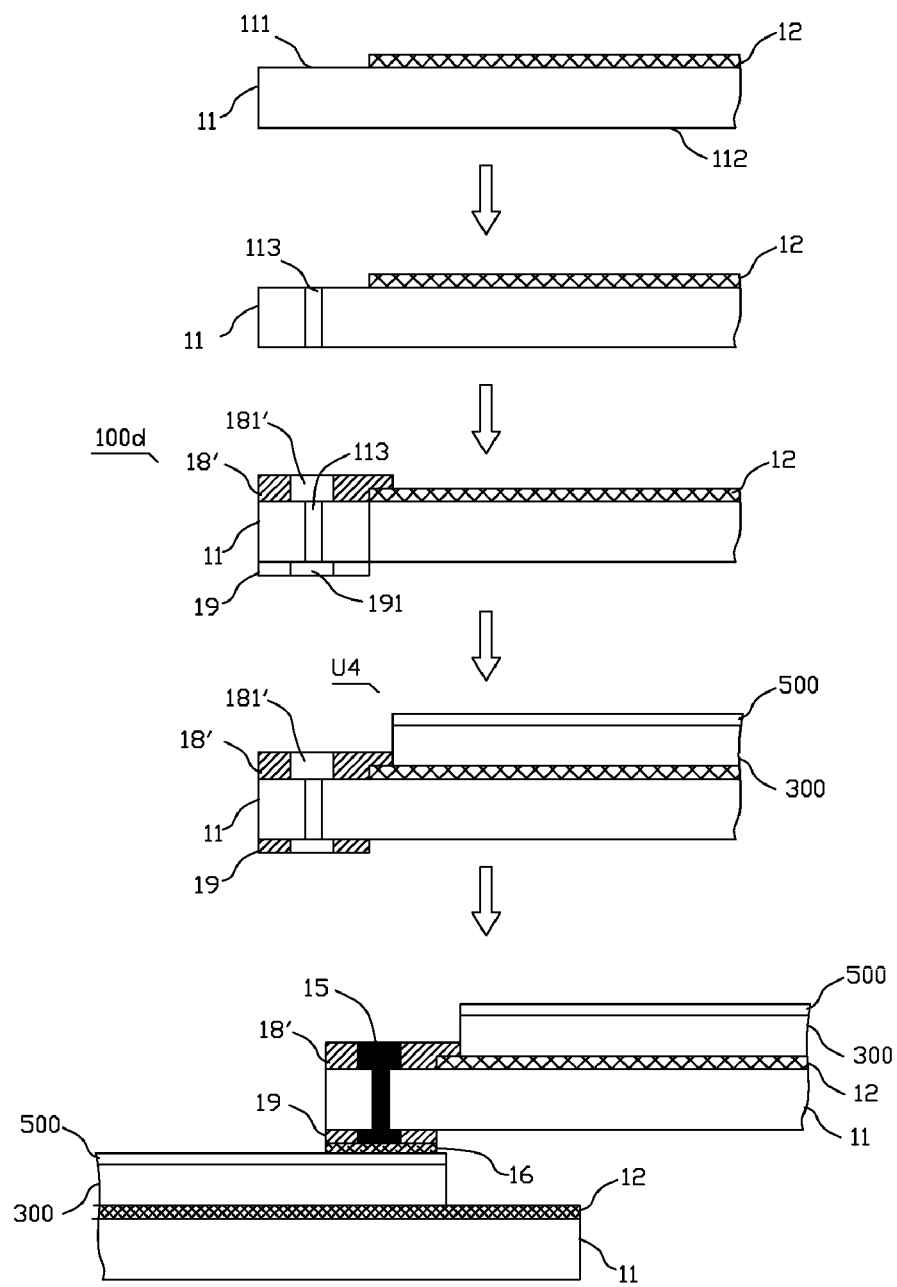
FIG. 13 is a schematic diagram of a process for manufacturing a seventh kind of flexible organic solar battery module in a typical embodiment of the present disclosure.

Referring to FIG. 13, in a typical embodiment of the present disclosure, a method for manufacturing a seventh kind of flexible organic solar battery module is similar to the method for manufacturing the fifth kind of flexible organic solar battery module. A difference lies in the following:

S1: manufacturing and forming a continuous transparent electrode 12 on a first surface 111 of a flexible light-transmittance insulating base 11;

S2: forming one or more through holes 113 in a selected region on the flexible light-transmittance insulating base 11, where each through hole 113 runs through the flexible light-transmittance insulating base 11 along a thickness direction, and the selected region may be an edge region or other suitable regions of the flexible light-transmittance insulating base 11, on which no transparent electrode 12' is distributed;

S3: respectively manufacturing an electrode 18' (which may also be defined as a fourth electrode) on the first surface 111 of the flexible light-transmittance insulating base 11 by means of printing, coating, adhesive dispensing, vacuum evaporation or magnetron sputtering, where a window 181' corresponding to the through hole 113 is formed in the electrode 18', thus forming a bottom electrode 100d of one battery unit;

S4: manufacturing a functional layer 300', a top electrode 500 and the like in sequence on the transparent electrode 12 of the bottom electrode 100d by a method known in the art, thus forming an intact battery unit $U_4$, where the functional layer 300' may include an electron transfer layer, a hole transfer layer and an active layer or a laminated battery;

S5: applying a proper amount of conductive paste or the like to the electrode 18' (particularly the window 181') of one battery unit, and filling the through hole 113 with the conductive paste, thus forming a conducting channel 15; and S6: fitting the battery unit to another battery unit, adhering the second surface 112 of the flexible light-transmittance insulating base 11 to the top electrode 500 of another battery unit using a conductive adhesive layer 16, and electrically connecting the transparent electrode 12 and the electrode 18' in the battery unit to the top electrode of another battery unit through the conducting channel 15 and the conductive adhesive layer 16 so that the two battery units are disposed in series, thus forming the desired flexible organic solar battery module.

In this embodiment, the functional layer 300' can also completely cover the electrode 18' and the transparent electrode 12.

The technical solutions of the present disclosure are described in more detail below in combination with several embodiments and accompanying drawings. It should be pointed that unless otherwise stated, all raw materials, chemical agents, equipment and the like used in the following embodiments can be purchased on the market. The operations such as printing, spraying, spin-coating and magnetron sputtering can be implemented according to the methods known in the art.

Embodiment 1: A method for manufacturing a flexible film solar battery module may refer to FIG. 1, including the following steps:

S1, manufacturing a light-transmittance silver nanowire electrode (i.e., the foregoing first electrode) on a front surface (the first surface) of a PI film with a thickness of about 300 um;

S2, forming one or more through holes in an edge region of the PI film by means of machining or laser ablation, where each through hole continuously runs through the PI film along a thickness direction; each through hole may be circular, polygonal or of other irregular shapes; a perimeter of a single through hole may be ranged from about 10 um to 50 um, and an area of an opening of the through hole on the front surface of the PI film or an area of an opening on a back surface (the second surface) is smaller than 0.03 $mm^2$; and further, protrusion heights of the edges of the openings of each through hole on the front and back surfaces of the PI film can be controlled to be less than 1 um;

S3, respectively manufacturing two silver wire electrodes (i.e., the second electrode and the third electrode) on the front surface and the back surface of the PI film by means of silk-screen printing or the like, where the second electrode can be disposed around the first electrode and is in contact or laminated with an edge part of the first electrode; these silver wire electrodes can be configured in a form of a conducting wire, a width of which can be set to be less than or equal to 5 mm, preferably less than or equal to 1 mm, and an equivalent square resistance of which is less than or equal to 5 Ω/sq, preferably less than or equal to 1 Ω/sq; compared with the first electrode, each of the second electrode and the third electrode has a protrusion height at the highest point of less than 5 um, preferably less than 1 um; further, these silver wire electrodes are provided with continuous windows or discrete windows corresponding to all the through holes; and an area of each of these windows is larger than the area of the opening of each through hole on a surface of the PI film;

S4, manufacturing an electron transfer layer (such as a zinc oxide film layer with a thickness of about 50 nm), an active layer (such as PM6:Y6 active layer with a thickness of about 100 nm), a hole transfer layer (such as a $MoO_3$ film with a thickness of about 10 nm) and a metal top electrode (such as metal Al with a thickness of about 100 nm) in sequence on the first electrode according to a method known in the art, thus forming one film solar battery unit;

S5: applying a proper amount of conductive paste to the second electrode and the third electrode of one battery unit, and filling the through holes with part of the conductive silver paste through the windows formed in the second electrode and the third electrode, thus forming a conducting channel between the second electrode and the third electrode;

S6: fitting the battery unit to another battery unit, and adhering the third electrode of the battery unit to the top electrode of another battery unit using the conductive paste left on the foregoing second electrode and third electrode so that the two battery units are disposed in series; and S7: repeating the operation of the foregoing step S6 until a plurality of battery units are fitted to form the desired flexible organic solar battery module, and performing operations such as packaging.

In the foregoing step S5, a metal can be deposited into the windows formed in the second electrode and the third electrode, and the through holes by means of magnetron sputtering and metal evaporation, thus forming the conducting channel.

In the foregoing step S6, the third electrode 14 of one battery unit can also be adhered and electrically connected to the top electrode 500 of another battery unit through a conductive adhesive layer.

Embodiment 2: A method for manufacturing a flexible film solar battery module includes the following steps:

S1, forming an ITO transparent conductive layer (the first electrode) on a front surface (the first surface) of a PET film with a thickness of about 150 um;

S2, forming a plurality of through holes in the PET film, where each through hole perpendicularly runs through the PET film and is circular, polygonal or of other irregular shapes; a perimeter of a single through hole may be ranged from about 500 um to 800 um, and an area of an opening of the through hole on the front surface of the PET film or an area of an opening on a back surface is smaller than 0.13 mm$^2$; and protrusion heights of the edges of the openings of each through hole on the front and back surfaces of the PET film are both less than 5 um;

S3, respectively performing magnetron sputtering on Ag in regions, provided with the foregoing through holes, on the front surface and the back surface of the PET film to form two Ag electrodes (the second electrode and the third electrode), where a thickness of each Ag electrode is greater than protrusion heights of edges of openings of each through hole on the front surface and the back surface of the PET film, and deposited regions of the Ag electrodes cover and go beyond the edge of the opening of each through hole in a surface of the PET film by 50 um or above; the second electrode is disposed around the ITO transparent conductive layer and is in contact and laminated with an edge part of the ITO transparent conductive layer; each Ag electrode can be configured in a form of a conducting wire, a width of which can be set to be less than or equal to 5 mm, preferably less than or equal to 1 mm, and an equivalent square resistance of which is less than or equal to 5 Ω/sq, preferably less than or equal to 1 Ω/sq; and compared with the ITO transparent conductive layer, the second electrode has a protrusion height at the highest point of less than 5 um, preferably less than 1 um;

S4-S5, performing the same operations as those in Embodiment 1;

S6: fitting the battery unit to another battery unit, and adhering the third electrode of the battery unit to the top electrode of another battery unit using the conductive paste left on the foregoing second electrode and third electrode or by additionally coating a conductive adhesive layer so that the two battery units are disposed in series; and S7, performing the same operation as that in Embodiment 1.

Embodiment 3: A method for manufacturing a flexible film solar battery module is basically the same as that in Embodiment 1, and a difference lies in the following: the operation of the step S3 is performed before the operation of the step S2 is performed, that is, the PI film is machined from the windows formed in the second electrode and the third electrode, thus forming the through holes. The operations of the solution of this embodiment are more difficult than those in Embodiment 1.

Embodiment 4: A method for manufacturing a flexible film solar battery module is basically the same as that in Embodiment 1, and a difference lies in the following:

in the step S3, no window is formed in the manufactured second electrode, but a window is formed in the third electrode;

in the step S5, the battery unit is placed upside down, and conductive silver paste is applied to the third electrode;

the through holes is filled with part of the conductive silver paste through the window in the third electrode, thus forming a conducting channel between the second electrode and the third electrode.

This embodiment can avoid the problem of a partial short circuit of the transparent electrode due to the fact that the conductive silver paste flows onto the transparent electrode.

Embodiment 5: A method for manufacturing a flexible film solar battery module is basically the same as that in Embodiment 1, and a difference lies in the following: the operation of the step S3 is performed first, but no windows are formed in the formed second electrode and third electrode; the operation of the step S2 is then performed to machine and form through holes that continuously run through the second electrode, the PI film and the third electrode. The operations of the solution of this embodiment are more difficult than those in Embodiment 1.

The advantages of the technical solutions provided in the above embodiments 1-5 of the present disclosure include:

first, the process for manufacturing a large-area flexible organic solar battery module can be greatly simplified, and the cost can be reduced;

second, the effective area of an organic solar battery can be almost utilized 100%; and third, compared with a single-battery module, the prepared solar battery module has the benefit that the photoelectric conversion efficiency of a battery is nearly not reduced, so that preparation of an efficient large-area solar battery module can be achieved.

Figure 7:
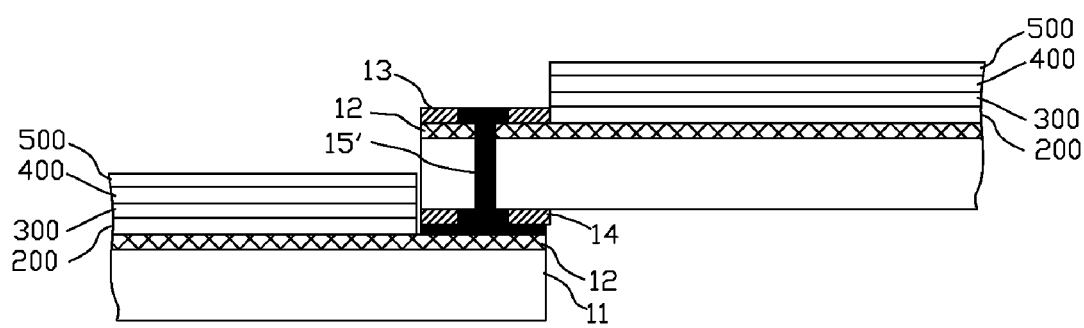
FIG. 7 is a schematic structural diagram of a flexible organic solar battery module manufactured in Embodiment 6 of the present disclosure.

Embodiment 6: A method for manufacturing a flexible film solar battery module is basically the same as that in Embodiment 1, and a difference lies in that: Referring to FIG. 7, the second electrode 13 is at least partially laminated on the first electrode 12 and is electrically connected to the third electrode 14 through a conducting channel 15'.

Figure 8:
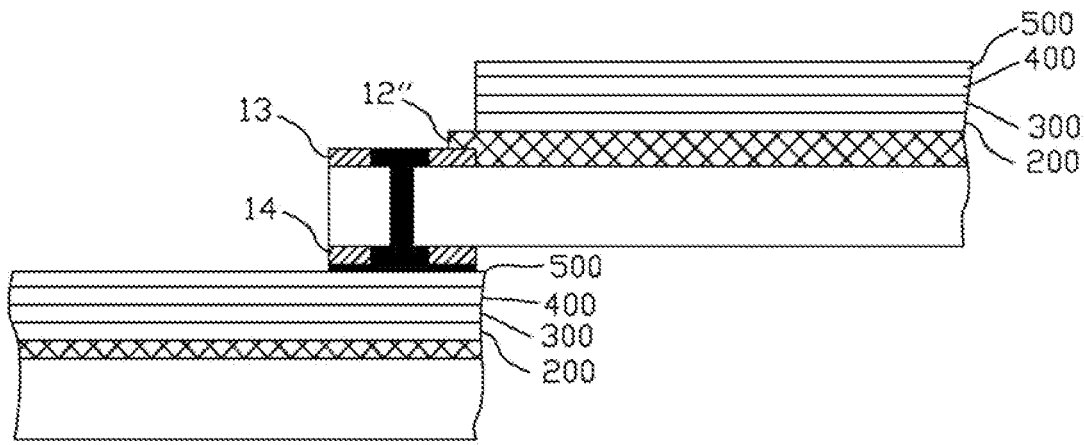
FIG. 8 is a schematic structural diagram of a flexible organic solar battery module manufactured in Embodiment 7 of the present disclosure.

Embodiment 7: A method for manufacturing a flexible film solar battery module is basically the same as that in Embodiment 1, and a difference lies in that: Referring to FIG. 8, the second electrode 13 is partially covered by an electrode 12" (which can also be defined as the first electrode) and is electrically connected to the third electrode 14 through a conducting channel 15.

Embodiment 8: A method for manufacturing a flexible film solar battery module may refer to FIG. 9, including the following steps:

S1, manufacturing a light-transmittance silver nanowire electrode on a front surface (the first surface) of a PI film with a thickness of about 300 um, where the silver nanowire electrode covers the entire front surface of the PI film;

S2, forming one or more through holes in an edge region of the PI film by means of machining or laser ablation, where each through hole continuously runs through the silver nanowire electrode and the PI film along a thickness direction; each through hole may be circular, polygonal or of other irregular shapes;

S3, manufacturing an electron transfer layer (such as a zinc oxide film layer with a thickness of about 50 nm), an active layer (such as PM6:Y6 active layer with a thickness of about 100 nm), a hole transfer layer (such as a MoO$_3$ film with a thickness of about 10 nm) and a metal top electrode (such as metal Al with a thickness of about 100 nm) in sequence on the silver nanowire electrode according to a method known in the art, thus forming one film solar battery unit;

S4, applying a proper amount of conductive silver paste to a region, provided with the foregoing through holes, on the front surface of the PI film, and filling the through holes with the conductive silver paste, thus forming a conducting channel between the front surface and the back surface of the PI film; and S5: adhering the back surface of one battery unit to the metal top electrode of another battery unit using a conductive adhesive layer to adhere the silver nanowire electrode of the battery unit to the top electrode of another battery unit through the conducting channel and the conductive adhesive layer so that the two battery units are disposed in series, thus forming the desired flexible organic solar battery module, and then performing operations such as packaging.

In this embodiment, the process for manufacturing the flexible film solar battery module is simple, easy to operate and low in cost.

In the foregoing step S4, a metal can be deposited into the through holes by means of magnetron sputtering and metal evaporation, thus forming the conducting channel.

Embodiment 9: Referring to FIG. 10, a method for manufacturing a flexible film solar battery module provided in this embodiment is similar to that in Embodiment 8, and a difference lies in the following:

In the step S4, the conductive silver paste can be coated on the region, provided with the through holes, on the front surface of the PI film by means of silk-screen printing and photogravure, and the through holes are filled with part of the conductive silver paste to form the conducting channel between the front surface and the back surface of the PI film. The remaining conductive silver paste is left on the front surface of the PI film to form one silver wire electrode (the foregoing sixth electrode). The silver wire electrode preferably has a structure similar to that of the second electrode in Embodiment 1. The silver wire electrode can provide a low-cost and high-performance "highway" for a large-area transparent electrode without changing the conductivity of the transparent silver nanowire electrode itself, thus effectively improving the overall performance of a product.

Embodiment 10: Referring to FIG. 11, a method for manufacturing a flexible film solar battery module provided in this embodiment is similar to that in Embodiment 1, and a difference lies in the following:

In the step S1, the formed silver nanowire electrode covers the entire front surface of the PI film.

In the step S3, one silver wire electrode (i.e., the fourth electrode) is manufactured on a surface of the silver nanowire electrode by means of silk-screen printing or the like, and the structure of the fourth electrode is the same as or similar to that of the foregoing second electrode.

In this embodiment, the step S3 and the step S2 can be transposed. That is, the fourth electrode is manufactured and formed first; the through holes that continuously run through the fourth electrode and the PI film are then manufactured; and the operations of the steps S4-S6 are later performed.

Embodiment 11: Referring to FIG. 12, a method for manufacturing a flexible film solar battery module provided in this embodiment is similar to that in Embodiment 1, and a difference lies in the following:

In the step S1, the formed silver nanowire electrode covers the entire front surface of the PI film.

In the step S3, two silver wire electrodes 18 and 19 (i.e., the fourth electrode and the fifth electrode) are respectively manufactured on a surface of the silver nanowire electrode and the back surface of the PI film by means of silk-screen printing or the like, and the structures of the fourth electrode and the fifth electrode are the same as or similar to those of the foregoing second electrode and third electrode.

In this embodiment, the step S3 and the step S2 can be transposed. That is, the fourth electrode and the fifth electrode are manufactured and formed first; the through holes that continuously run through the fourth electrode, the PI film and the fifth electrode are then manufactured; and the operations of the steps S4-S6 are later performed.

Embodiment 12: Referring to FIG. 13, a method for manufacturing a flexible film solar battery module provided in this embodiment is similar to that in Embodiment 7, and a difference lies in the following:

In the step S3, one silver wire electrode (which can also be defined as the fourth electrode) is manufactured on a surface of the silver nanowire electrode by means of silk-screen printing or the like, and the structure of the silver wire electrode can have a similar structure to that of the second electrode in Embodiment 1, but an inner edge part of the silver wire electrode is laminated on the silver nanowire electrode.

In this embodiment, the step S3 and the step S2 can be transposed. That is, the fourth electrode is manufactured and formed first; the through holes that continuously run through the fourth electrode and the PI film are then manufactured; and the operations of the steps S4-S6 are later performed.

Figure 14:
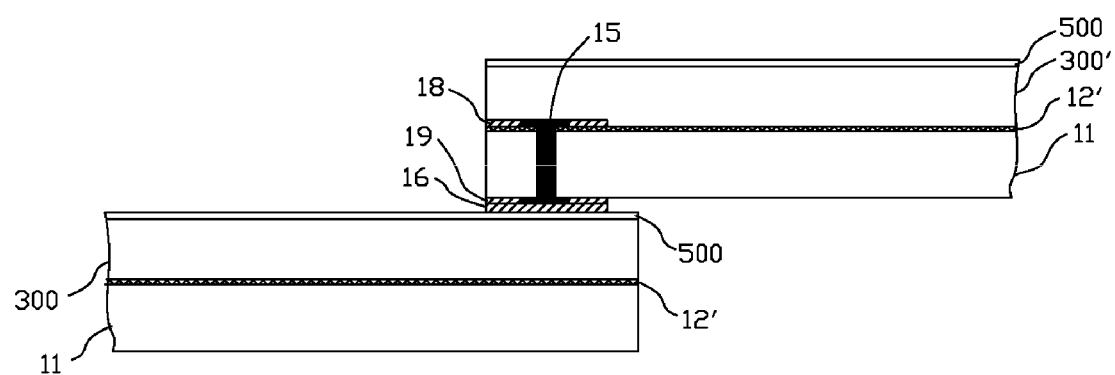
FIG. 14 is a schematic structural diagram of a flexible organic solar battery module manufactured in Embodiment 13 of the present disclosure.

Embodiment 13: A method for manufacturing a flexible film solar battery module provided in this embodiment is similar to that in Embodiment 11, and a difference lies in the following:

In the step S3, a fourth electrode 18 and a fifth electrode 19 are respectively manufactured on a surface of a silver nanowire electrode 12' and the back surface of the PI film; through holes that continuously run through the fourth electrode, the PI film and the fifth electrode are then manufactured; a functional layer 300' is later manufactured on the surface of the silver nanowire electrode. The functional layer 300' completely covers the fourth electrode 18 and the silver nanowire electrode 12', and the operations of the steps S4-S6 are later performed. The structure of the flexible film solar battery module manufactured in this embodiment is as shown in FIG. 14.

In addition, with reference to Embodiments 1-13, those skilled in the art can also manufacture a flexible film light-emitting diode module and a flexible film photoelectric detector module in combination with other conventional operations in the art.

It should be understood that the embodiments described above are part of the embodiments of the present disclosure, and not all the embodiments. Detailed descriptions of the embodiments of the present disclosure are not intended to limit the scope of the present disclosure for which protection is requested, but represent only the selected embodiments of the present disclosure. Based on the embodiments in present disclosure, all other embodiments obtained by those of ordinary skill in the art without creative work shall fall within the protection scope of the present disclosure.

What is claimed is:

1. A flexible photoelectric device module, comprising at least two photoelectric device units, wherein a first photoelectric device unit of the at least two photoelectric device units comprises a bottom electrode, a functional layer and a top electrode, wherein the bottom electrode, the functional layer and the top electrode are disposed in sequence along a predetermined direction;

wherein the bottom electrode comprises:
 a light-transmittance insulating base;

a first electrode and a second electrode, wherein the first electrode and the second electrode are arranged on a first surface of the light-transmittance insulating base; and a third electrode arranged on a second surface of the light-transmittance insulating base;

wherein the first surface and the second surface are disposed facing away from each other; the first electrode is a transparent electrode; the second electrode is in electric contact with the first electrode; the second electrode is electrically connected to the third electrode through a conducting channel;

wherein the conducting channel comprises:
a through hole, wherein the through hole runs through the light-transmittance insulating base along a thickness direction, and
a conductor, wherein the conductor is arranged in the through hole;

wherein the third electrode in the first photoelectric device unit is electrically connected to a top electrode or a first electrode in a second photoelectric device unit of the at least two photoelectric device units, so that the first photoelectric device unit and the second photoelectric device unit are connected in series or in parallel, wherein at least a partial region of the at least one second electrode is covered by the first electrode, and/or, the at least one second electrode is distributed around the first electrode, and/or, at least the partial region of the at least one second electrode is encircled by the first electrode, wherein each of the at least one second electrode is a conducting wire, and/or, the at least one second electrode surrounds or half surrounds the first electrode, wherein a window is matched with the through hole, the window is further formed in the second electrode and/or the third electrode, and a conducting slurry or a metal is configured to fill the through hole through the window, wherein the conducting slurry and the metal are configured for forming the conductor.

2. The flexible photoelectric device module according to claim 1, wherein the conducting wire has a width of less than or equal to 5 mm; and/or, compared with the first electrode, the at least one second electrode has a protrusion height of less than 5 um at a highest point; and/or, an equivalent square resistance of the conducting wire is less than or equal to 5 Ω/sq.

3. The flexible photoelectric device module according to claim 1, wherein the through hole continuously runs through the light-transmittance insulating base and the second electrode and/or the third electrode along the predetermined direction; and/or, the conductor is formed by a conducting slurry or a metal, wherein the conducting slurry fills the through hole, and the metal is deposited in the through hole; and the conducting slurry comprises silver paste or a conductive adhesive.

4. The flexible photoelectric device module according to claim 1, wherein the flexible photoelectric device module comprises a flexible film light-emitting diode, a flexible film photovoltaic battery or a flexible film photoelectric detector; and/or, the second surface of the light-transmittance insulating base in the first photoelectric device unit is further connected to the top electrode or a bottom electrode in the second photoelectric device unit through a conductive adhesive layer.

5. A manufacturing method for the flexible photoelectric device module according to claim 1, comprising:

respectively manufacturing the at least two photoelectric device units, and
connecting the at least two photoelectric device units in series and/or in parallel;
wherein a manufacturing method for the at least two photoelectric device units comprises a step of manufacturing the bottom electrode, the functional layer and the top electrode in sequence on the first surface of the light-transmittance insulating base;
a step of manufacturing the bottom electrode comprises:
disposing the first electrode and the second electrode on the first surface of the light-transmittance insulating base, and controlling the second electrode and the first electrode to be in electric contact with each other;
disposing the third electrode on the second surface of the light-transmittance insulating base, wherein the second surface faces away from the first surface;
machining regions on the light-transmittance insulating base to form at least one through hole, wherein the regions correspond to the second electrode and the third electrode, and the at least one through hole runs through the light-transmittance insulating base along the thickness direction; and
when a conducting slurry is applied to the first surface or the second surface of the light-transmittance insulating base, or a metal is deposited on the first surface or the second surface of the light-transmittance insulating base, and at least part of the conducting slurry or at least part of the metal fills the at least one through hole to form the conductor, forming the conducting channel, wherein the conducting channel runs through the light-transmittance insulating base, wherein the second electrode is electrically connected to the third electrode.

6. The manufacturing method according to claim 5, wherein the step of manufacturing the bottom electrode comprises: disposing the second electrode on the first surface of the light-transmittance insulating base and/or disposing the third electrode on the second surface of the light-transmittance insulating base, and machining the second electrode and/or the third electrode and the light-transmittance insulating base to form the at least one through hole, wherein the at least one through hole continuously runs through the second electrode and/or the third electrode and the light-transmittance insulating base.

7. The manufacturing method according to claim 5, wherein the step of manufacturing the bottom electrode comprises:
forming the at least one through hole in a region on the light-transmittance insulating base, wherein the region corresponds to the second electrode and the third electrode;
respectively disposing the second electrode and the third electrode on the first surface and the second surface of the light-transmittance insulating base, and forming a window in the second electrode or the third electrode, wherein the window is matched with the at least one through hole;
when the conducting slurry is applied to the window of the second electrode and/or the third electrode, or the metal is deposited at the window of the second electrode and/or the third electrode, and the at least part of the conducting slurry or the at least part of the metal fills the at least one through hole to form a conductor, forming the conducting channel.

8. The manufacturing method according to claim 7, wherein the step of manufacturing the bottom electrode comprises: forming windows respectively in the second electrode and the third electrode, wherein the windows are matched with the at least one through hole.

9. The manufacturing method according to claim 7, comprising:
- putting each of the at least two photoelectric device units into a positioning template;
- applying the conducting slurry to the window on the second electrode and/or the third electrode of the first photoelectric device unit, or depositing the metal at the window on the second electrode and/or the third electrode of the first photoelectric device unit, and filling the at least one through hole with the at least part of the conducting slurry or the at least part of the metal to form the conducting channel; and
- fitting the first photoelectric device unit to the second photoelectric device unit by using the conducting slurry left on the second electrode and/or the third electrode, and electrically connecting the third electrode in the first photoelectric device unit to the top electrode or the first electrode in the second photoelectric device unit through the conducting slurry.

10. The manufacturing method according to claim 5, further comprising: connecting the second surface of the light-transmittance insulating base in the first photoelectric device unit to the top electrode or the bottom electrode in the second photoelectric device unit through a conductive adhesive layer.

* * * * *